US011355680B2

(12) United States Patent
Odnoblyudov et al.

(10) Patent No.: US 11,355,680 B2
(45) Date of Patent: *Jun. 7, 2022

(54) LED ARRAY PACKAGE

(71) Applicant: BRIDGELUX, INC., Fremont, CA (US)

(72) Inventors: Vladimir Odnoblyudov, Danville, CA (US); Scott West, Pleasanton, CA (US); Cem Basceri, Livermore, CA (US); Zhengqing Gan, Livermore, CA (US)

(73) Assignee: BRIDGELUX, INC., Fremont, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/132,325

(22) Filed: Dec. 23, 2020

(65) Prior Publication Data

US 2021/0226104 A1 Jul. 22, 2021

Related U.S. Application Data

(63) Continuation of application No. 16/267,958, filed on Feb. 5, 2019, now Pat. No. 10,903,403, which is a continuation of application No. 14/449,142, filed on Jul. 31, 2014, now Pat. No. 10,205,069.

(51) Int. Cl.
*H01L 33/56* (2010.01)
*H01L 33/46* (2010.01)

(52) U.S. Cl.
CPC .............. *H01L 33/56* (2013.01); *H01L 33/46* (2013.01)

(58) Field of Classification Search
CPC ......... H01L 33/56; H01L 33/46; H01L 33/52; H01L 33/50; F21V 23/005; F21V 7/00; F21V 7/22
See application file for complete search history.

(56) References Cited

U.S. PATENT DOCUMENTS

| 6,335,548 | B1 | 1/2002 | Roberts et al. | |
| 10,205,069 | B2* | 2/2019 | Odnoblyudov | ......... H01L 33/56 |
| 10,903,403 | B2* | 1/2021 | Odnoblyudov | ......... H01L 33/46 |
| 2006/0063287 | A1 | 3/2006 | Andrews | |
| 2006/0226774 | A1* | 10/2006 | Sofue | .................. C09D 183/04 |
| | | | | 313/512 |
| 2010/0025722 | A1 | 2/2010 | Wada | |
| 2011/0031502 | A1* | 2/2011 | Bergmann | .............. H01L 33/46 |
| | | | | 257/77 |
| 2012/0068615 | A1 | 3/2012 | Duong et al. | |
| 2012/0138978 | A1* | 6/2012 | Tsang | .................. H01L 25/0753 |
| | | | | 257/89 |
| 2012/0319142 | A1 | 12/2012 | Donofrio | |
| 2013/0334559 | A1 | 12/2013 | Vdovin et al. | |
| 2014/0091329 | A1* | 4/2014 | Lee | ........................ H01L 33/644 |
| | | | | 257/88 |
| 2014/0175481 | A1* | 6/2014 | Tischler | ................ H01L 31/048 |
| | | | | 257/98 |
| 2014/0346533 | A1* | 11/2014 | Andrews | ............. H01L 25/0753 |
| | | | | 257/88 |

* cited by examiner

*Primary Examiner* — Bao Q Truong

(74) *Attorney, Agent, or Firm* — ArentFox Schiff LLP

(57) ABSTRACT

Various aspects of a light emitting apparatus includes a substrate. Various aspects of the light emitting apparatus include a light emitting die arranged on the substrate. The light emitting die includes one or more side walls. Various aspects of the light emitting apparatus include a reflective die attach material extending along the one or more side walls of the light emitting die.

25 Claims, 5 Drawing Sheets

LED ARRAY PACKAGE

CROSS-REFERENCE TO RELATED APPLICATIONS

This application is a continuation of U.S. patent application Ser. No. 16/267,958, filed on Feb. 5, 2019, which is a continuation of U.S. patent application Ser. No. 14/449,142, filed on Jul. 31, 2014, now U.S. Pat. No. 10,205,069, the contents of which are incorporated herein reference in their entireties.

BACKGROUND

Field

The present disclosure relates generally to vertical LEDs and, more particularly, to vertical LEDs having light output that is similar to the light output by lateral LEDs.

Background

Solid state light emitting devices, such as light emitting dies (LEDs), are attractive candidates for replacing conventional light sources such as incandescent, halogen, and fluorescent lamps. LEDs have substantially longer lifetimes than all three of these types of conventional light sources. In addition, some types of LEDs now have higher conversion efficiencies than fluorescent light sources and still higher conversion efficiencies have been demonstrated in laboratories. Finally, LEDs contain no mercury or other potentially dangerous materials, therefore, providing various safety and environmental benefits.

Several different LED designs exist today, including vertical LEDs and lateral LEDs. Vertical LEDs have been considered as a replacement for lateral LEDs in array packages because vertical LEDs perform better than conventional lateral LEDs. However, simply using a vertical LED as a "drop-in" replacement for a lateral LED produces a 20% lumen drop in most LED chip-on-board configurations due to the occurrence of light absorbing effects between LEDs. Therefore, it is difficult to use vertical LEDs as a replacement for lateral LEDs without additional optimization to account for the lumen drop.

SUMMARY

Several aspects of the present invention will be described more fully hereinafter with reference to various apparatuses.

One aspect of a light emitting apparatus includes a substrate. The light emitting apparatus includes a light emitting die arranged on the substrate. The light emitting die includes one or more side walls. The light emitting apparatus includes a reflective die attach material extending along the one or more side walls of the light emitting die.

Another aspect of the light emitting apparatus includes a substrate. The light emitting apparatus includes a light emitting die arranged on the substrate. The light emitting die includes a translucent carrier substrate.

One aspect of a lamp includes a housing. The lamp includes a light emitting apparatus coupled to the housing. The light emitting apparatus includes a substrate. The light emitting apparatus includes several light emitting dies arranged on the substrate. Each of the light emitting dies includes one or more side walls. The light emitting apparatus includes a reflective die attach material extending along the one or more side walls of each of the light emitting dies.

BRIEF DESCRIPTION OF THE DRAWINGS

The various aspects of the present invention illustrated in the drawings may not be drawn to scale. Rather, the dimensions of the various features may be expanded or reduced for clarity. In addition, some of the drawings may be simplified for clarity. Thus, the drawings may not depict all of the components of a given apparatus or method.

Various aspects of the present invention will be described herein with reference to drawings that are schematic illustrations of idealized configurations of the present invention. As such, variations from the shapes of the illustrations as a result, for example, manufacturing techniques and/or tolerances, are to be expected. Thus, the various aspects of the present invention presented throughout this disclosure should not be construed as limited to the particular shapes of elements (e.g., regions, layers, sections, substrates, bulb shapes, etc.) illustrated and described herein but are to include deviations in shapes that result, for example, from manufacturing. By way of example, an element illustrated or described as a rectangle may have rounded or curved features and/or a gradient concentration at its edges rather than a discrete change from one element to another. Thus, the elements illustrated in the drawings are schematic in nature and their shapes are not intended to illustrate the precise shape of an element and are not intended to limit the scope of the present invention.

Figure 1A:
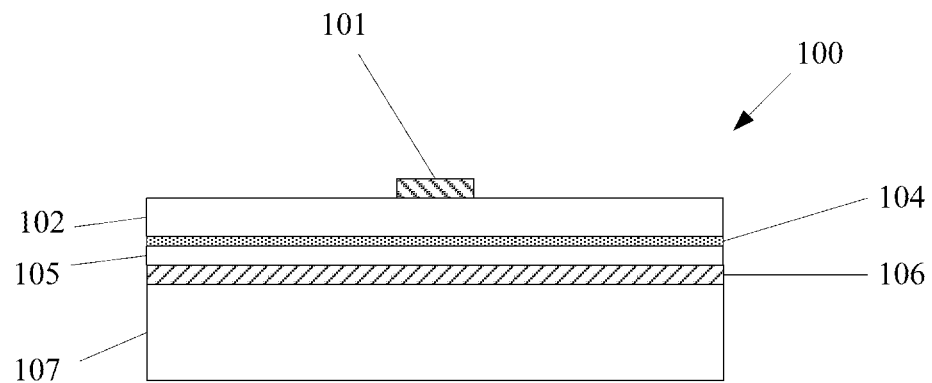

Various aspects of apparatuses will now be presented in the detailed description by way of example, and not by way of limitation, with reference to the accompanying drawings, wherein:

FIG. 1a illustrates a cross-section view of an exemplary embodiment of a vertical LED.

Figure 1B:
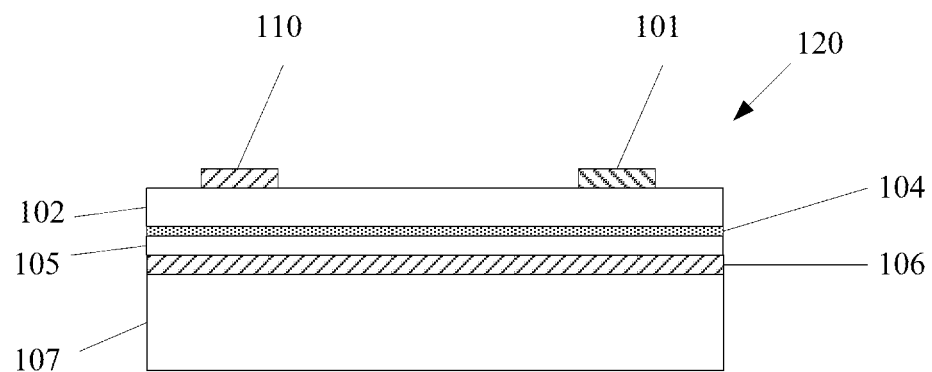

FIG. 1b illustrates cross-section view of a vertical LED having p-electrode 110 routed to the top of the vertical LED.

Figure 2A:
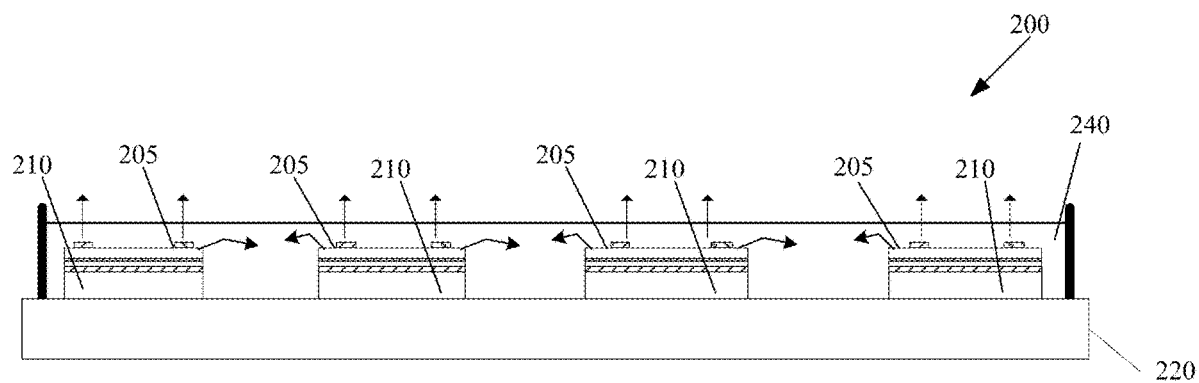

FIG. 2a illustrates a plan view of an exemplary embodiment of a light emitting device.

Figure 2B:
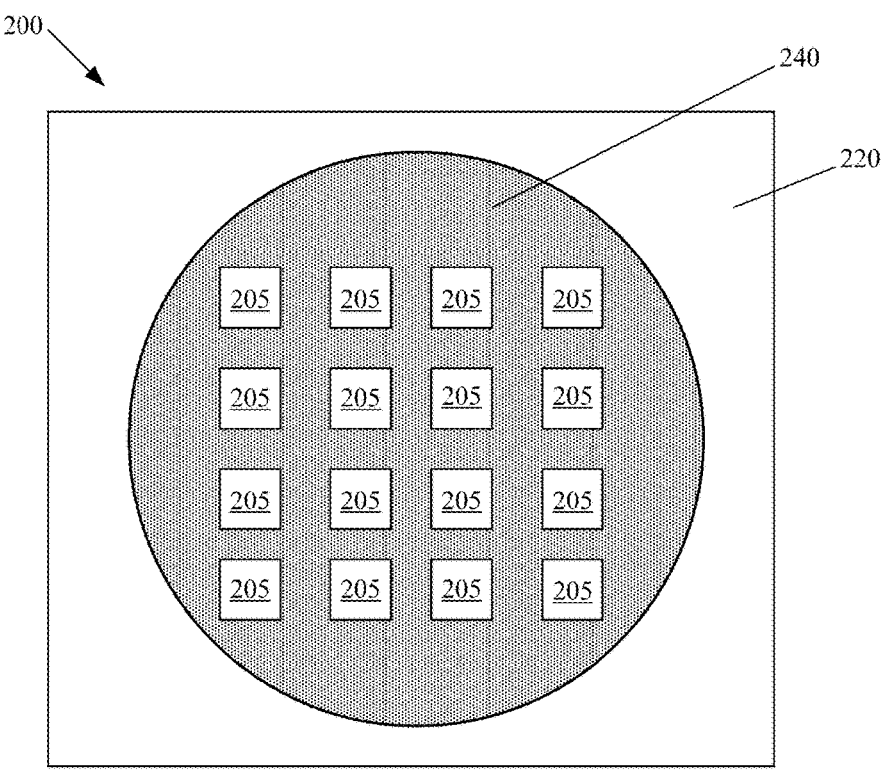

FIG. 2b illustrates a top level view of an exemplary embodiment of a light emitting device.

Figure 3:
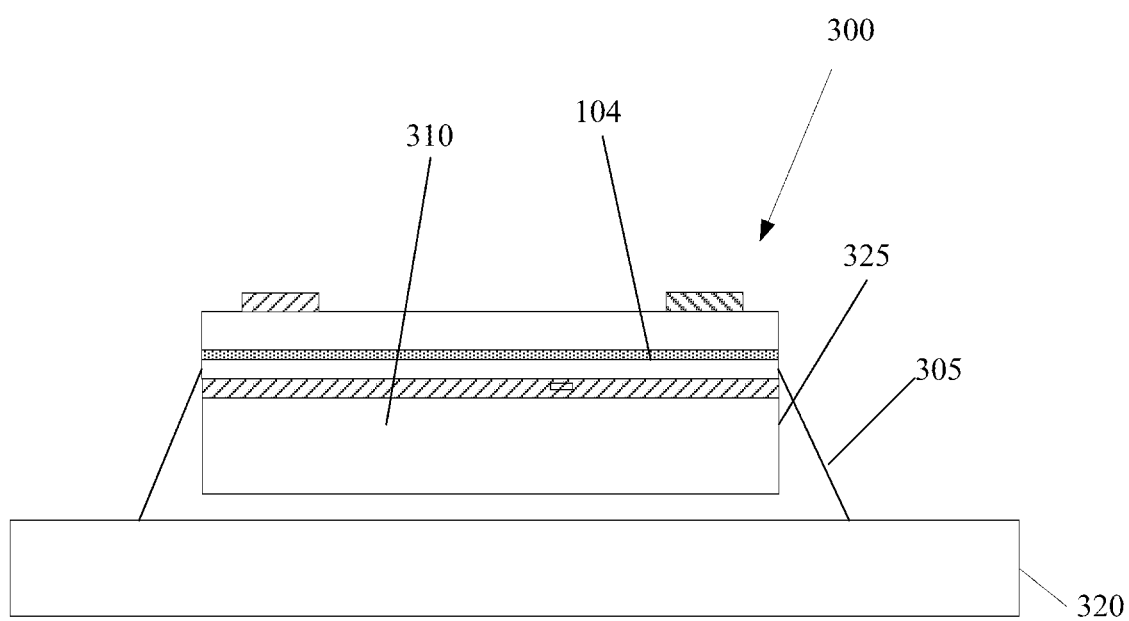

FIG. 3 illustrates a cross-section view of an exemplary embodiment of an LED having a die attach material.

Figure 4A:
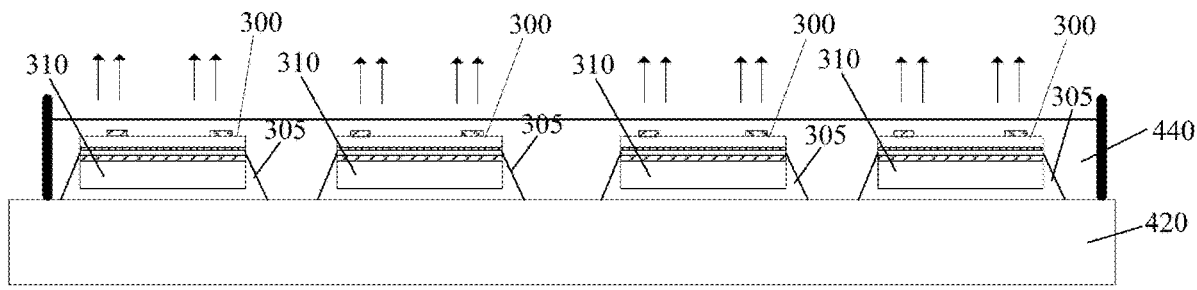

FIG. 4a illustrates a cross-section view of an exemplary embodiment of an LED device.

Figure 4B:
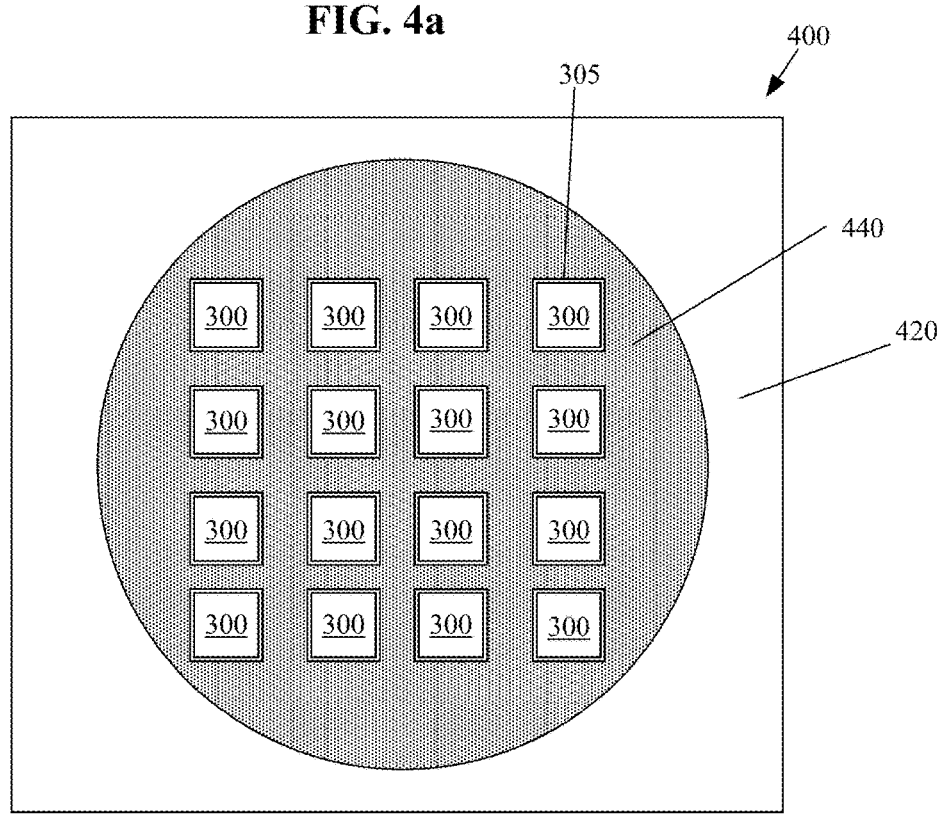

FIG. 4b illustrates a top level view of an exemplary embodiment of the light emitting device.

Figure 5A:
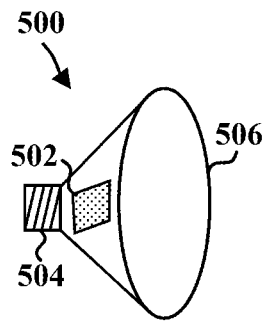
Figure 5B:
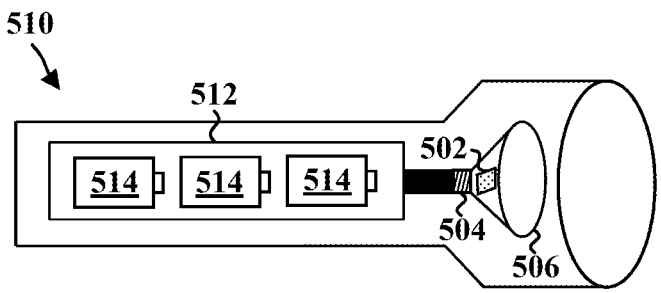
Figure 5C:
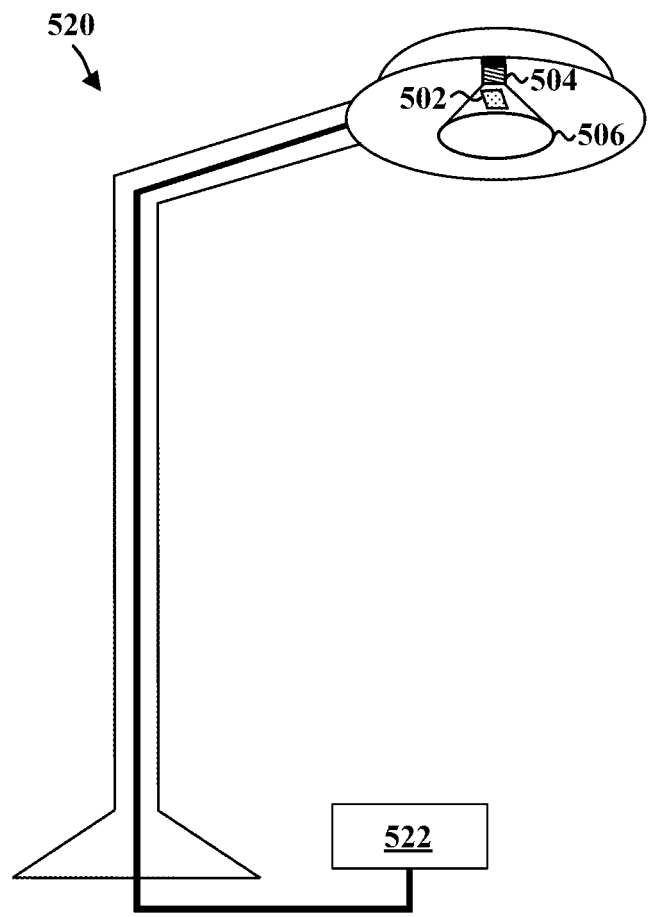

FIGS. 5a-5c are side view illustrations of various exemplary apparatuses having a light-emitting device.

DETAILED DESCRIPTION

The detailed description set forth below in connection with the appended drawings is intended as a description of various exemplary embodiments of the present invention and is not intended to represent the only embodiments in which the present invention may be practiced. The detailed description includes specific details for the purpose of providing a thorough understanding of the present invention. However, it will be apparent to those skilled in the art that the present invention may be practiced without these specific details. In some instances, well-known structures and components are shown in block diagram form in order to avoid obscuring the concepts of the present invention. Acronyms and other descriptive terminology may be used merely for convenience and clarity and are not intended to limit the scope of the invention.

The word "exemplary" is used herein to mean serving as an example, instance, or illustration. Any embodiment described herein as "exemplary" is not necessarily to be construed as preferred or advantageous over other embodiments. Likewise, the term "embodiment" of an apparatus, method or article of manufacture does not require that all embodiments of the invention include the described components, structure, features, functionality, processes, advantages, benefits, or modes of operation.

It will be understood that when an element such as a region, layer, section, substrate, or the like, is referred to as being "on" another element, it can be directly on the other element or intervening elements may also be present. In contrast, when an element is referred to as being "directly on" another element, there are no intervening elements present. It will be further understood that when an element is referred to as being "formed" on another element, it can be grown, deposited, etched, attached, connected, coupled, or otherwise prepared or fabricated on the other element or an intervening element.

Furthermore, relative terms, such as "beneath" or "bottom" and "above" or "top," may be used herein to describe one element's relationship to another element as illustrated in the drawings. It will be understood that relative terms are intended to encompass different orientations of an apparatus in addition to the orientation depicted in the drawings. By way of example, if an apparatus in the drawings is turned over, elements described as being "above" other elements would then be oriented "below" other elements and vice versa. The term "above", can therefore, encompass both an orientation of "above" and "below," depending of the particular orientation of the apparatus. Similarly, if an apparatus in the drawing is turned over, elements described as "below" other elements would then be oriented "above" the other elements. The terms "below" can, therefore, encompass both an orientation of above and below.

It will be further understood that the terms "comprises" and/or "comprising," when used in this specification, specify the presence of stated features, steps, operations, elements, and/or components, but do not preclude the presence or addition of one or more other features, integers, steps, operations, elements, components, and/or groups thereof. The term "and/or" includes any and all combinations of one or more of the associated listed items.

Unless otherwise defined, all terms (including technical and scientific terms) used herein have the same meaning as commonly understood by a person having ordinary skill in the art to which this invention belongs. It will be further understood that terms, such as those defined in commonly used dictionaries, should be interpreted as having a meaning that is consistent with their meaning in the context of the relevant art and the present disclosure and will not be interpreted in an idealized or overly formal sense unless expressly so defined herein.

In the following detailed description, various aspects of the present invention will be presented in the context of a light-emitting die. A light-emitting die shall be construed broadly to include any suitable semiconductor light source such as, by way of example, a light emitting diode (LED) or other semiconductor material which releases photons or light through the recombination of electrons and holes flowing across a p-n junction. Accordingly, any reference to an LED or other light source throughout this disclosure is intended only to illustrate the various aspects of the present invention, with the understanding that such aspects may have a wide range of applications.

The following description describes a vertical LED array design for replacing lateral LED array designs. The vertical LED design described in the foregoing paragraphs provides a light output that is similar to conventional lateral LED arrays. As will be discussed in detail in the foregoing paragraphs, by providing a translucent substrate and a reflective die attach material that surrounds the vertical LEDs of an array, similar light output to conventional lateral LEDs is realized.

FIG. 1a illustrates a cross-section view of an exemplary embodiment of a vertical LED 100. An LED is a semiconductor material impregnated, or doped, with impurities. These impurities add "electrons" or "holes" to the semiconductor, which can move in the material relatively freely. Depending on the kind of impurity, a doped region of the semiconductor can have predominantly electrons or holes, and is referred respectively as n-type or p-type semiconductor regions.

Referring to FIG. 1, the LED 100 includes an n-type semiconductor region 102 and a p-type semiconductor region 105. A reverse electric field is created at the junction between the two regions, which cause the electrons and holes to move away from the junction to form an active region 104. When a forward voltage sufficient to overcome the reverse electric field is applied vertically across the p-n junction through a pair of electrodes 101, 106, electrons and holes are forced into the active region 104 and recombine. When electrons recombine with holes, they fall to lower energy levels and release energy in the form of light.

In this example, the n-type semiconductor region 102 is formed on a growth substrate (not shown) and the active layer is formed between the n-type semiconductor region 102 and the p-type semiconductor region 105. The p-type electrode 106 is directly or indirectly formed on the p-type semiconductor layer 105. The growth substrate, on which the n-type semiconductor layer 102 is formed, is removed so that the patterned n-type electrode 101 can be formed on the surface of the n-type semiconductor region 102 that was attached to the growth substrate. However, the n-type semiconductor region and the p-type semiconductor region of this example may be reversed. For instance, the p-type semiconductor region 105 may be formed on the growth substrate. As those skilled in the art will readily appreciate, the various concepts described throughout this disclosure may be extended to any suitable layered structure. Additional layers or regions (not shown) may also be included in the LED 100, including but not limited to buffer, nucleation, contact and current spreading layers or regions, as well as light extraction layers.

The n-type semiconductor layer and the p-type semiconductor layer may comprise gallium nitride. As shown in FIG. 1 below the n-p type semiconductor layers is a broad area reflective p-type electrode 106, and a thermally conductive substrate 107 to support the device structure mechanically. The p-type electrode reflects light produced by the active layer 104 so that it is not absorbed by the substrate 107 below. The conductive substrate may comprise a transparent or translucent material such as silicon or aluminum nitride. As will be discussed in greater detail below, aluminum nitride is preferable over silicon in chip-on-board LED packages because it absorbs less light than silicon.

In the vertical LED of FIG. 1a the p-type electrode 106 is formed below the n-p semiconductor layers. However, in some aspects of the light emitting device, it is possible to route the p-electrode to the top of the vertical LED structure.

FIG. 1b illustrates cross-section view of a vertical LED 120 having p-electrode 110 routed to the top of the vertical LED. As shown, both n-electrode 101 and p-electrode 110 are above the n-p semiconductor layer. Thus, electrical traces can be connected directly to the n-electrode 110, providing greater flexibility in designing the vertical LED array of the chip-on-board package.

FIG. 2a illustrates a plan view of an exemplary embodiment of a light emitting device 200. The light emitting device includes several vertical LEDs 205 having translucent substrates 210. As discussed in the preceding paragraphs, the translucent substrate may comprise aluminum nitride. The light emitting device also includes a substrate 220 and a phosphor layer 240.

As shown, the vertical LEDs 205 are arranged on the substrate 220. The substrate 220 may be comprised of layers of aluminum, anodized aluminum, silver, and a distributed bragg reflector (DBR). The vertical LEDs 205 are also covered by the phosphor layer 240 which scatters some of the light produced by the vertical LEDs 205. The phosphor layer, which will be discussed in greater detail with respect to FIG. 2b, may comprise phosphor particles that scatter the light from the vertical LEDs in different directions. The scattered light, in some aspects of the device, could be redirected to an adjacent vertical LED. If the adjacent vertical LED comprises material that is light absorbing, at least some of the redirected light will be absorbed by the adjacent vertical LED. When light is absorbed rather than output, the device's performance suffers.

The vertical LEDs 205 in this exemplary figure have a translucent substrate 210, which has lower light absorption properties than commonly used substrate materials such as silicon. Thus, light absorption between adjacent vertical LEDs is reduced by the translucent substrate 210 leading to better light output from the light emitting device. For instance, the translucent substrate may provide a 10% lumen increase in light output over a conventional silicon substrate. Additionally, the substrate may be optically tuned to make the substrate more or less translucent so that the LED array can be further customized for different devices.

FIG. 2b illustrates a top level view of an exemplary embodiment of the light emitting device 200. The light emitting device includes an array of the vertical LEDs 205, the phosphor layer 240, and the substrate 220. As shown, the substrate 220 may be used to support a number of vertical LEDs 205. The phosphor layer 240 may be deposited within a cavity defined by an annular, or other shaped boundary that extends around the upper surface of the substrate 220. The boundary may be formed by a suitable mold or, alternatively, formed separately from the substrate 220 and attached to the substrate using an adhesive or other suitable means. The phosphor layer 240 may include phosphor particles suspended in an epoxy, silicone, or other carrier that may be constructed from soluble phosphor that is dissolved in the carrier. As discussed above with respect to FIG. 2a, light emitted from each of the vertical LEDs 205 may be scattered by the phosphor layer and partially absorbed by adjacent LEDs. However, the translucent substrates 210 of the vertical LEDs 205 partially remedies the absorption issue because it absorbs less light than other conventional substrates such as silicon. However, the incorporation of a reflective adhesive material that surrounds the vertical LED may further remedy light absorption issues between vertical LEDs in a chip-on-board package.

FIG. 3 illustrates a cross-section view of an exemplary embodiment of a vertical LED 300 attached to a substrate 320 by a die attach material 305. The vertical LED 300 includes a translucent substrate 310 as described in detail with respect to FIGS. 1 and 2, and is arranged on the substrate 320. The die attach material 305 is used to bond the vertical LED 300 to the substrate 320. The die attach material also covers at least portion of the side walls 325 of the vertical LED 300. In some aspects of the device, the die attach material may cover a portion of the side wall 325 of the vertical LED 300 that at least half the height of the vertical LED. In such aspects, the die attach material 305 may cover a portion of the vertical LED 300 that is up to, but not over the active region 104, which was discussed in detail with respect to FIG. 1.

The die attach material increases the light output of vertical LEDs arranged in an array by decreasing light absorption between the vertical LEDs that are arranged close to each other. In some aspects of the device, the die attach material may be a white epoxy because white epoxy forms a reflective surface. However, the die attach material may be any adhesive suitable for bonding the vertical LED to the substrate 320 that also has reflective properties. By limiting light absorption further, the reflective die attach material may boost the light output of a vertical LED array by another 10% lumen (in addition to the 10% lumen increase produced by the translucent substrate).

FIG. 4a illustrates a cross-section view of an exemplary embodiment of light emitting device 400. The light emitting device 400 includes several vertical LEDs 300 arranged on a substrate 420. The LED device 400 of FIG. 4 is similar to the LED device 200 of FIG. 2 in that both devices include several LEDs arranged on a substrate. However, as will be discussed, LED device 400 is designed to perform better than the light emitting device 200 because to the inclusion of die attach material 305 provides a higher light output.

Referring to FIG. 4a, as shown, the die attach material 305 is used to bond each of the LEDs 300 to the substrate 420. The substrate 420 may include material similar to that of substrate 220 described with respect to FIG. 2a. Additionally, the die attach material covers at least a portion of the side walls of each of the vertical LEDs 300.

As discussed above, the die attach material 305 comprises a reflective material such as white epoxy. As a result, light that is scattered by the phosphor layer is reflected by the die attach material that would have otherwise been absorbed by the vertical LED.

As illustrated in FIG. 4a, the die attach material increases light output of the LED device 400 because light absorption between LEDs is reduced. Thus, more light is reflected away from adjacent vertical LEDs by the die attach material 305. In some aspects of the device, this design increases light output by 10% lumen. Thus, the combination of a translucent substrate and die attach material produces a light output similar to the light output of conventional lateral LEDs, making this design a suitable replacement for lateral LEDs in a chip-on-board configuration.

FIG. 4b illustrates a top level view of an exemplary embodiment of the light emitting device 400. The light emitting device 400 includes similar features to those of light emitting device 200 described with respect to FIG. 2b. For instance, the light emitting device 400 includes an array of the vertical LEDs 300, the phosphor layer 440, and the substrate 420. However, the light emitting device 400 additionally includes the reflective die attach material 305 that surrounds the side walls of each of the LEDs 300 in the array. Thus, greater light output is realized by the light emitting device because the die attach material prevents light that is scattered by phosphor layer 440 from being absorbed by the vertical LEDs 305.

FIG. 5a is a side view illustration of an exemplary lamp 500 having a light emitting device 502. Lamp 500 may be used for any type of general illumination. For example, lamp 500 may be used in an automobile headlamp, street light, overhead light, or in any other general illumination application. The light emitting device 502 may be located in a housing 506. The light emitting device 502 may receive power via a power connection 504. The light emitting device 502 may be configured to emit light. Description pertaining to the process by which light is emitted by the light-emitting device 202 is provided with reference to FIG. 4.

FIG. 5b is a side view illustration of a flashlight 510, which is an exemplary embodiment of an apparatus having the light emitting device 502. The light emitting device 502 may be located inside of the housing 506. The flashlight 510 may include a power source. In some aspects of the light emitting device, the power source may include batteries 514 located inside of a battery enclosure 512. In another aspect of the light emitting device, power source 910 may be any other suitable type of power source, such as a solar cell. The power connection 504 may transfer power from the power source (e.g., the batteries 514) to the light-emitting device 502.

FIG. 5c is a side view illustration of a street light 520, which is another exemplary embodiment of an apparatus having the light emitting device 502. The light emitting device 502 may be located inside of the housing 506. The street light 520 may include a power source. In some exemplary embodiments, the power source may include a power generator 522. The power connection 504 may transfer power from the power source (e.g., the power generator 522) to the light emitting device 502.

The various aspects of this disclosure are provided to enable one of ordinary skill in the art to practice the present invention. Various modifications to exemplary embodiments presented throughout this disclosure will be readily apparent to those skilled in the art, and the concepts disclosed herein may be extended to other devices. Thus, the claims are not intended to be limited to the various aspects of this disclosure, but are to be accorded the full scope consistent with the language of the claims. All structural and functional equivalents to the various components of the exemplary embodiments described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. § 112(f) unless the element is expressly recited using the phrase "means for" or, in the case of a method claim, the element is recited using the phrase "step for."

What is claimed is:

1. A light emitting apparatus comprising:
   a base substrate;
   an array of vertical light emitting diodes that each have a translucent substrate and one or more side walls extending from the base substrate; and
   a light scattering layer that covers the array of vertical light emitting diodes and is constructed to scatter light produced by each of the vertical light emitting diodes,
   wherein the light scattering layer is disposed in a cavity defined by a boundary wall that extends around an upper surface of the base substrate,
   wherein at least a portion of an outer side of one or more side walls of the vertical light emitting diodes is surrounded by a reflective die attach material that reduces absorption of the scatter light between the vertical light emitting diodes.

2. The light emitting apparatus of claim 1, wherein the translucent substrate of each of the vertical light emitting diodes comprises aluminum nitride.

3. The light emitting apparatus of claim 1, wherein the light scattering layer comprises a phosphor layer.

4. The light emitting apparatus of claim 3, wherein the phosphor layer comprises phosphor particles suspended in at least one of an epoxy and a silicone.

5. The light emitting apparatus of claim 1, wherein the reflective die attach material secures each vertical light emitting diode to the base substrate.

6. The light emitting apparatus of claim 1, wherein each of the vertical light emitting diodes comprises an active region configured to emit light, with the vertical light emitting diode disposed on the base substrate and the translucent substrate of the vertical light emitting diodes having the one or more side walls that extend in a vertical direction orthogonal to the base substrate.

7. The light emitting apparatus of claim 1, wherein the reflective die attach material extends in the vertical direction and covers the portion of the outer sides of the respective one or more side walls of the vertical light emitting diodes.

8. The light emitting apparatus of claim 1, wherein the reflective die attach material comprises white epoxy.

9. The light emitting apparatus of claim 1, wherein the reflective die attach material extends along at least half of a height of the outer side of the one or more side walls.

10. The light emitting apparatus of claim 1,
    wherein each of the vertical light emitting diodes comprises a gallium nitride layer over an aluminum nitride substrate, and
    wherein a reflective layer is disposed between the gallium nitride layer and the aluminum nitride substrate.

11. The light emitting apparatus of claim 1, wherein the reflective die attach material is constructed to prevent absorption of the scatter light from the light scattering layer.

12. The light emitting apparatus of claim 1, further comprising a reflective die attach material that surrounds the one or more side walls of each of the vertical light emitting diodes.

13. The light emitting apparatus of claim 12, wherein the reflective die attach material is directly secured to each of the vertical light emitting diodes.

14. A lamp comprising:
    a housing;
    a light emitting apparatus coupled to the housing, the light emitting apparatus comprising:
      a base substrate;
      an array of vertical light emitting diodes that each have a translucent substrate and one or more side walls extending from the base substrate; and
      a light scattering layer that covers the array of vertical light emitting diodes and is constructed to scatter light produced by each of the vertical light emitting diodes,
      wherein the light scattering layer is disposed in a cavity defined by a boundary wall that extends around an upper surface of the base substrate,
      wherein at least a portion of an outer side of one or more side walls of the vertical light emitting diodes is surrounded by a reflective die attach material that reduces scattered light absorption between the vertical light emitting diodes.

15. The lamp of claim 14, wherein the translucent substrate of each of the vertical light emitting diodes comprises aluminum nitride.

16. The lamp of claim 14, wherein the light scattering layer comprises a phosphor layer.

17. The lamp of claim 16, wherein the phosphor layer comprises phosphor particles suspended in at least one of an epoxy and a silicone.

18. The lamp of claim 14, wherein the reflective die attach material secures each of the vertical light emitting diode to the base substrate.

19. The lamp of claim 14, wherein each of the vertical light emitting diodes comprises an active region configured to emit light, with the vertical light emitting diode disposed on the base substrate and the translucent substrate of the vertical light emitting diodes having the one or more side walls that extend in a vertical direction orthogonal to the base substrate.

20. The lamp of claim 14, wherein the reflective die attach material extends in the vertical direction and covers the portion of the outer sides of the respective one or more side walls of the vertical light emitting diodes.

21. The lamp of claim 14, wherein the reflective die attach material comprises white epoxy.

22. The lamp of claim 14, wherein the reflective die attach material extends along at least half of a height of the outer side of the one or more side walls.

23. The lamp of claim 14,
wherein each of the vertical light emitting diodes comprises a gallium nitride layer over an aluminum nitride substrate, and
wherein the light emitting apparatus further comprises a reflective layer disposed between the gallium nitride layer and the aluminum nitride substrate.

24. The lamp of claim 14, wherein the light emitting apparatus further comprises a reflective die attach material that surrounds the one or more side walls of each of the vertical light emitting diodes.

25. The light emitting apparatus of claim 24, wherein the reflective die attach material is directly secured to each of the vertical light emitting diodes.

* * * * *